（12） United States Patent
Khim et al.

(10) Patent No.: US 12,237,239 B2
(45) Date of Patent: Feb. 25, 2025

(54) SEMICONDUCTOR DEVICE AND MANUFACTURING METHOD THEREOF

(71) Applicant: Amkor Technology Singapore Holding Pte. Ltd., Singapore (SG)

(72) Inventors: Jin Young Khim, Seoul (KR); Ji Young Chung, Gyeonggi-do (KR); Ju Hoon Yoon, Gyeonggi-do (KR); Kwang Woong Ahn, Seoul (KR); Ho Jeong Lim, Seoul (KR); Tae Yong Lee, Gyeonggi-do (KR); Jae Min Bae, Seoul (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 155 days.

(21) Appl. No.: 17/555,790

(22) Filed: Dec. 20, 2021

(65) Prior Publication Data

US 2022/0293482 A1    Sep. 15, 2022

Related U.S. Application Data

(63) Continuation of application No. 16/114,589, filed on Aug. 28, 2018, now Pat. No. 11,205,602, which is a
(Continued)

(51) Int. Cl.
*H01L 23/31* (2006.01)
*H01L 21/683* (2006.01)
(Continued)

(52) U.S. Cl.
CPC ...... *H01L 23/3128* (2013.01); *H01L 21/6835* (2013.01); *H01L 21/6836* (2013.01);
(Continued)

(58) Field of Classification Search
CPC ............ H01L 23/3128; H01L 21/6835; H01L 21/6836; H01L 21/76885; H01L 23/481;
(Continued)

(56) References Cited

U.S. PATENT DOCUMENTS 8,445,323 B2   5/2013  Lin et al.
9,171,797 B2   10/2015 Lin et al.
(Continued)

FOREIGN PATENT DOCUMENTS

CN   102386113 A   3/2012
CN   103151274 A   6/2013
(Continued)

OTHER PUBLICATIONS

First Official Letter and Search Report for Chinese Patent Application No. 201610816082.6, issued Oct. 28, 2023, 29 pages.
(Continued)

*Primary Examiner* — Victor A Mandala
*Assistant Examiner* — Colleen E Snow
(74) *Attorney, Agent, or Firm* — McAndrews, Held & Malloy, Ltd.

(57) ABSTRACT

A semiconductor device and a method of manufacturing a semiconductor device. As a non-limiting example, various aspects of this disclosure provide a stackable semiconductor device with small size and fine pitch and a method of manufacturing thereof.

20 Claims, 7 Drawing Sheets

Related U.S. Application Data continuation of application No. 15/219,511, filed on Jul. 26, 2016, now Pat. No. 10,062,626.

(51) Int. Cl.
<table>
<tr><td>*H01L 21/768*</td><td>(2006.01)</td></tr>
<tr><td>*H01L 23/00*</td><td>(2006.01)</td></tr>
<tr><td>*H01L 23/48*</td><td>(2006.01)</td></tr>
<tr><td>*H01L 23/498*</td><td>(2006.01)</td></tr>
<tr><td>*H01L 25/10*</td><td>(2006.01)</td></tr>
</table>

(52) U.S. Cl.
CPC ...... *H01L 21/76885* (2013.01); *H01L 23/481* (2013.01); *H01L 23/49811* (2013.01); *H01L 23/49838* (2013.01); *H01L 24/09* (2013.01); *H01L 24/81* (2013.01); *H01L 23/49833* (2013.01); *H01L 24/16* (2013.01); *H01L 24/32* (2013.01); *H01L 24/73* (2013.01); *H01L 24/92* (2013.01); *H01L 25/105* (2013.01); *H01L 2221/68331* (2013.01); *H01L 2221/68363* (2013.01); *H01L 2224/05023* (2013.01); *H01L 2224/05124* (2013.01); *H01L 2224/05624* (2013.01); *H01L 2224/08238* (2013.01); *H01L 2224/13101* (2013.01); *H01L 2224/1319* (2013.01); *H01L 2224/1329* (2013.01); *H01L 2224/16145* (2013.01); *H01L 2224/16225* (2013.01); *H01L 2224/32225* (2013.01); *H01L 2224/73204* (2013.01); *H01L 2224/80895* (2013.01); *H01L 2224/81801* (2013.01); *H01L 2224/8185* (2013.01); *H01L 2224/81894* (2013.01); *H01L 2224/81895* (2013.01); *H01L 2224/92125* (2013.01); *H01L 2924/01013* (2013.01); *H01L 2924/01029* (2013.01); *H01L 2924/10253* (2013.01); *H01L 2924/1431* (2013.01); *H01L 2924/1433* (2013.01); *H01L 2924/15311* (2013.01); *H01L 2924/18161* (2013.01)

(58) Field of Classification Search
CPC ......... H01L 23/49811; H01L 23/49838; H01L 24/09; H01L 24/81; H01L 23/49833; H01L 24/16; H01L 24/32; H01L 24/73; H01L 24/92; H01L 25/105
See application file for complete search history.

(56) References Cited

U.S. PATENT DOCUMENTS

| | | |
|---|---|---|
| 9,761,534 B2 | 9/2017 | Hsu et al. |
| 11,069,540 B2 * | 7/2021 | Chou ................ H01L 23/49811 |
| 2011/0147901 A1 | 6/2011 | Huang |
| 2013/0127048 A1 | 5/2013 | Hasegawa et al. |
| 2014/0367841 A1 | 12/2014 | Huang et al. |
| 2015/0187746 A1 | 7/2015 | Hsu et al. |
| 2015/0206854 A1 | 7/2015 | Lane et al. |
| 2016/0111410 A1 | 4/2016 | Pagaila et al. |

FOREIGN PATENT DOCUMENTS

| | | |
|---|---|---|
| CN | 103515362 A | 1/2014 |
| CN | 104681499 A | 6/2015 |
| TW | 201324779 | 6/2013 |
| TW | 201347050 | 11/2013 |
| TW | 201403689 | 1/2014 |
| TW | 201528387 | 7/2015 |
| TW | 201545361 | 12/2015 |
| TW | 201620147 | 6/2016 |
| TW | 201626574 | 7/2016 |

OTHER PUBLICATIONS

Notice of Preliminary Rejection for Korean Patent Application No. 10-2016-0139237, issued Oct. 3, 2022, 7 pages.
Korean Application for Application No. 1020160024802 filed Mar. 7, 2016, 70 pages.
Korean Application for Application No. 1020100027716 filed Mar. 11, 2010, 14 pages.
Search Report of International Application No. TW105125279 dated Dec. 17, 2019, 6 pages.
Second Official Letter for Chinese Patent Application No. 201610816082.6, issued Jul. 13, 2023, 26 pages.
Office Action for Taiwanese Patent Application No. 105125279, issued Jul. 25, 2022, 16 pages.
Official Letter for Taiwanese Patent Application No. 212133849, issued Feb. 21, 2024, 32 pages.
Official Letter for Taiwanese Patent Application No. 212133849, issued Oct. 15, 2024, 20 pages.

* cited by examiner

SEMICONDUCTOR DEVICE AND MANUFACTURING METHOD THEREOF

CROSS-REFERENCE TO RELATED APPLICATIONS/INCORPORATION BY REFERENCE

The present application is a continuation of U.S. application Ser. No. 16/114,589, filed Aug. 28, 2018, titled SEMICONDUCTOR DEVICE AND MANUFACTURING METHOD THEREOF, now U.S. Pat. No. 11,205,602, which is a continuation of U.S. application Ser. No. 15/219,511, filed Jul. 26, 2016, titled SEMICONDUCTOR DEVICE AND MANUFACTURING METHOD THEREOF, now U.S. Pat. No. 10,062,626, each of which is hereby incorporated herein by reference in its entirety.

BACKGROUND

Present semiconductor devices and methods for manufacturing semiconductor devices are inadequate, for example resulting in too-low sensitivity, excess cost, decreased reliability, or package sizes that are too large. Further limitations and disadvantages of conventional and traditional approaches will become apparent to one of skill in the art, through comparison of such approaches with the present disclosure as set forth in the remainder of the present application with reference to the drawings.

SUMMARY

Figure 1:
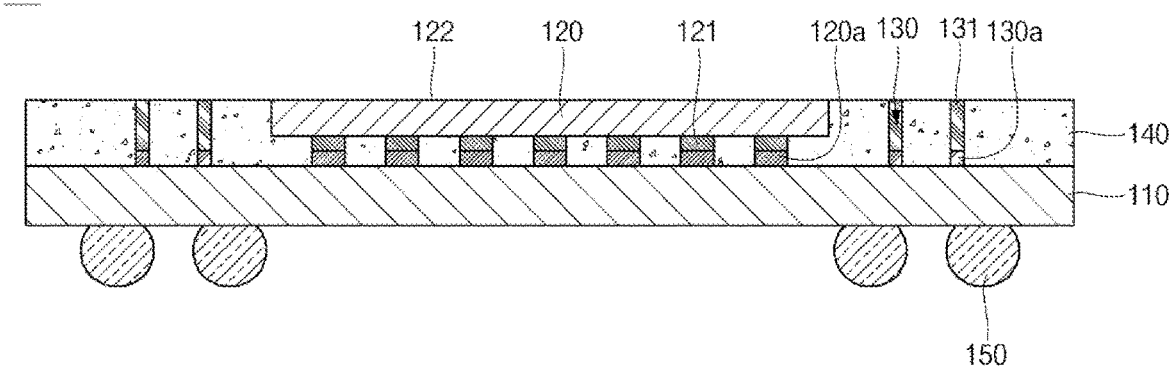
FIG. 1 shows a cross-sectional view of a semiconductor device according to various aspects of the present disclosure.

A semiconductor device and a method of manufacturing a semiconductor device. As a non-limiting example, various aspects of this disclosure provide a stackable semiconductor device with small size and fine pitch and a method of manufacturing thereof.

DETAILED DESCRIPTION OF VARIOUS ASPECTS OF THE DISCLOSURE

The following discussion presents various aspects of the present disclosure by providing examples thereof. Such examples are non-limiting, and thus the scope of various aspects of the present disclosure should not necessarily be limited by any particular characteristics of the provided examples. In the following discussion, the phrases "for example," "e.g.," and "exemplary" are non-limiting and are generally synonymous with "by way of example and not limitation," "for example and not limitation," and the like.

As utilized herein, "and/or" means any one or more of the items in the list joined by "and/or". As an example, "x and/or y" means any element of the three-element set $\{(x), (y), (x, y)\}$. In other words, "x and/or y" means "one or both of x and y." As another example, "x, y, and/or z" means any element of the seven-element set $\{(x), (y), (z), (x, y), (x, z), (y, z), (x, y, z)\}$. In other words, "x, y and/or z" means "one or more of x, y, and z."

The terminology used herein is for the purpose of describing particular examples only and is not intended to be limiting of the disclosure. As used herein, the singular forms are intended to include the plural forms as well, unless the context clearly indicates otherwise. It will be further understood that the terms "comprises," "includes," "comprising," "including," "has," "have," "having," and the like when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present disclosure. Similarly, various spatial terms, such as "upper," "above," "lower," "below," "side," "lateral," "horizontal," "vertical," and the like, may be used in distinguishing one element from another element in a relative manner. It should be understood, however, that components may be oriented in different manners, for example a semiconductor device may be turned sideways so that its "top" surface is facing horizontally and its "side" surface is facing vertically, without departing from the teachings of the present disclosure.

It will also be understood that terms coupled, connected, attached, and the like include both direct and indirect (e.g., with an intervening element) coupling, connecting, attaching, etc., unless explicitly indicated otherwise. For example, if element A is coupled to element B, element A may be indirectly coupled to element B through an intermediate signal distribution structure, element A may be directly coupled to element B (e.g., adhered directly to, soldered directly to, attached by direct metal-to-metal bond, etc.), etc.

In the drawings, the dimensions of structures, layers, regions, etc. (e.g., absolute and/or relative dimensions) may be exaggerated for clarity. While such dimensions are generally indicative of an example implementation, they are not limiting. For example, if structure A is illustrated as being larger than region B, this is generally indicative of an example implementation, but structure A is generally not required to be larger than structure B, unless otherwise indicated. Additionally, in the drawings, like reference numerals may refer to like elements throughout the discussion.

Various aspects of the present disclosure provide a semiconductor device, and a manufacturing method thereof, which may be characterized by a small footprint, small thickness, and fine pitch pattern spacing. The semiconductor device may, for example, be stackable.

Various aspects of the present disclosure provide a semiconductor device comprising a substrate, a semiconductor die coupled to one surface of the substrate, metal pillars coupled to a surface of the substrate, and an encapsulant that encapsulates the semiconductor die and the metal pillars and exposes the metal pillars. The metal pillars may, for example, be vertically formed along holes of the encapsulant.

Various aspects of the present disclosure provide a method of manufacturing a semiconductor device, the method comprising providing a carrier substrate including metal pillars and an insulation member surrounding the metal pillars, coating and patterning a photoresist on a surface of the insulation member, performing plating on the metal pillars, coupling the metal pillars to a substrate, removing the photoresist and the carrier substrate, and forming an encapsulant that encapsulates the metal pillars.

Various aspects of the present disclosure provide a method of manufacturing a semiconductor device, the method comprising providing a seed layer and a photoresist on a surface of a carrier substrate, forming metal pillars by performing plating in patterns of the photoresist, removing the photoresist, coupling the metal pillars to a substrate, forming an encapsulant that encapsulates the metal pillars, and removing the carrier substrate.

Various aspects of the present invention may, for example, provide a semiconductor device comprising metal pillars of a fine pitch on a top surface of a substrate, where the metal pillars are exposed to the outside of an encapsulant, thereby providing a stackable semiconductor device having a small size and fine pitch pattern spacing. The semiconductor device may also, for example, comprise an upper substrate coupled to the metal pillars.

Various aspects of the present disclosure will now be described in detail with reference to the accompanying drawings such that they may be readily practices by those skilled in the art.

FIG. 1 shows a cross-sectional view of a semiconductor device according to various aspects of the present disclosure. The example semiconductor device 100 may, for example, comprise a substrate 110, a semiconductor die 120, metal pillars 130, an encapsulant 140, and conductive balls 150.

The substrate 110 may, for example, be formed of a general printed circuit board (PCB) or a lead frame. Also, the substrate 110 may be formed of a silicon based build-up substrate in a semiconductor process. Although not separately shown, the substrate 110 may, for example, include one or more conductive layers (e.g., metal, etc.) that electrically couple pads formed on top and bottom surfaces of the substrate, providing for the overlying semiconductor die 120 or metal pillars 130 to be electrically connected to the underlying conductive balls 150. Such conductive layer(s) of the substrate 110 may, for example, comprise copper (Cu), aluminum (Al), alloys thereof, etc., but the scope of the present disclosure is not limited thereto. Additionally, for enhanced connectivity, a metal such as gold (Au) may be additionally applied to the pads.

The semiconductor die 120 may, for example, comprise integrated circuit chips separated (or singulated or diced) from a semiconductor wafer. The semiconductor die 120 may comprise any of a variety of different types of electrical circuitry, for example central processing units (CPUs), digital signal processors (DSPs), network processors, power management units, audio processors, RF circuits, wireless baseband system on chip (SoC) processors, sensors, application specific integrated circuits, and so on.

The semiconductor die 120 may, for example, input and/or output an electrical signal to and/or from a first surface (e.g., a bottom surface, etc.) through a conductive pad 121. The conductive pad 121 may, for example, be connected to internal patterns (or conductive layers) of the semiconductor die 120 and may generally include aluminum (Al) and/or other conductive materials. In addition, the conductive pad 121 of the semiconductor die 120 may be electrically connected to a ball (or pad or other interconnection structure) formed on a top surface of the substrate 110 through a conductive adhesion member 120a (e.g., comprising solder, conductive epoxy, etc.). Note that a direct metal-to-metal (e.g., solderless) intermetallic bond may be utilized also. The semiconductor die 120 may, for example, comprise a passivation layer that insulates regions other than a region at which the conductive pad 121 is exposed. Though only one conductive pad 121 is discussed, any number of such conductive pads may be present.

The semiconductor die 120 may, for example, comprise a second surface 122 (e.g., a top surface) opposite the first surface (e.g., bottom surface). The second surface 122 may, for example, be exposed to the outside (e.g., exposed from an encapsulating material). The second surface 122 may, for example, have a same height as a top surface of the encapsulant 140 to be exposed to the outside of the encapsulant 140. In this example configuration, the semiconductor die 120 may be configured to facilitate the emission of heat from the semiconductor die 120 to the outside.

The metal pillars 130 protrude from the top surface of the substrate 110. The metal pillars 130 may, for example, be made of a metal (e.g., copper, etc.), and may be positioned on regions other than a region where the semiconductor die 120 is positioned. The metal pillars 130 may, for example, be electrically connected to the substrate 110 through conductive adhesion members 130a (e.g., comprising solder, etc.). In addition, the metal pillars 130 may be exposed from an upper portion (e.g., from an upper surface) of the encapsulant 140. In some cases, ends 131 of the metal pillars 130 may extend further from the substrate 110 than the encapsulant 140, for example protruding from a top surface of the encapsulant 140. When another semiconductor device is stacked on the semiconductor device 100, the semiconductor devices may be electrically connected to each other through the metal pillars 130.

In an example implementation, the metal pillars 130 may, for example, have a width in the range of about 10 μm to about 15 μm. Therefore, compared to a case utilizing solder bumps having a diameter of about 350 μm, the metal pillars 130 may be implemented on the substrate 110 in a fine pitch, thereby reducing the overall size of the semiconductor device 100 including the substrate 110. In addition, many metal pillars 130 may be positioned on the substrate 110 having the same small size (and/or a variety of sizes), a higher degree of freedom can be attained in designing the semiconductor device 100.

The encapsulant 140 may, for example, be formed on a first surface (e.g., a top surface) of the substrate 110 to surround the semiconductor die 120 and the metal pillars 130 (e.g., to surround and/or contact lateral surfaces thereof, etc.). The encapsulant 140 may, for example, be made of any of a variety of materials (e.g., a general resin, etc.) and may protect the semiconductor die 120 and the metal pillars 130 from external impacts while fixing positions of the semiconductor die 120 and the metal pillars 130.

The conductive balls 150 (or any of a variety of interconnection structures, for example conductive bumps, conductive posts or pillars, etc.) may be formed under the substrate 110 (e.g., on a bottom surface of the substrate 110 in FIG. 1). The conductive balls 150 may, for example, be made of a solder and may be coupled to interconnection structures (e.g., pads, traces, balls, bumps, etc.) on a bottom surface of the substrate 110. The conductive balls 150 may later be connected to an external circuit to provide a path for inputting and/or outputting electrical signals to and/or from the substrate 110.

As described above, in the example semiconductor device 100, the metal pillars 130 having a fine pitch are positioned (or formed) on the top surface of the substrate 110 and are exposed to the outside of the encapsulant 140, thereby implementing a fine pitch and providing for the stacking of another semiconductor device on the semiconductor device 100 (or vice versa) while reducing the overall size.

In an example implementation, another substrate or interposer may be stacked (or formed) on the top side of the semiconductor die 120 and/or encapsulant 140. An example of such an implementation is provided at FIG. 2, as will now be described.

Figure 2:
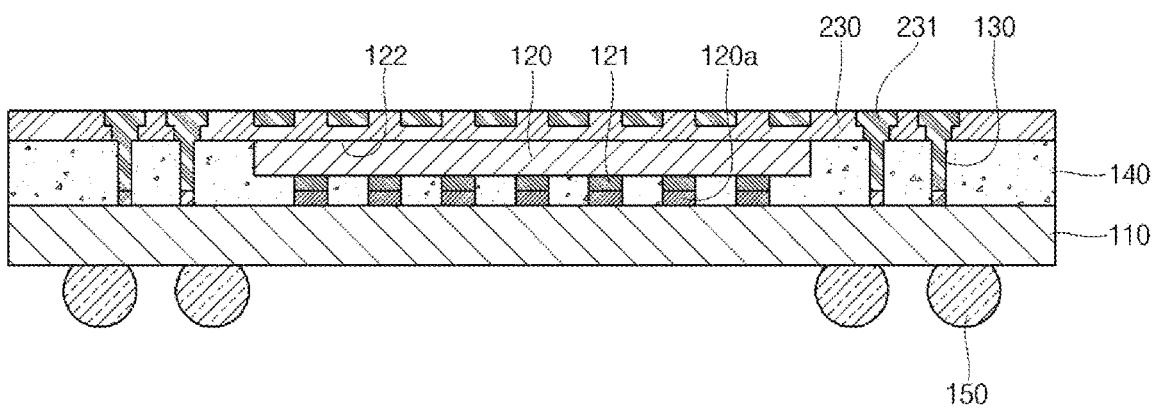
FIG. 2 shows a cross-sectional view of a semiconductor device according to various aspects of the present disclosure.

FIG. 2 shows a cross-sectional view of a semiconductor device according to various aspects of the present disclosure. The example, semiconductor device 200 may, for example, comprise a substrate 110, a semiconductor die 120, metal pillars 130, an upper substrate 230, an encapsulant 140, and conductive balls 150. The same functional components as those of the example semiconductor device 100 of FIG. 1 are denoted by the same reference numerals, and the following description will focus generally on differences between the example semiconductor device 200 of FIG. 2 and the example semiconductor device 100 of FIG. 1.

The upper substrate 230 is positioned along a top surface of the encapsulant 140. In addition, the upper substrate 230 comprises a plurality of conductive patterns 231 (or portions thereof) exposed from (or at) the bottom surface of the upper substrate 230 to the top surface of the encapsulant 140. The upper substrate 230 may be electrically connected to a semiconductor device stacked thereon through the conductive patterns 231 (or portions thereof) exposed from (or at) the top surface of the upper substrate 230. In addition, the conductive patterns 231 may be electrically connected to the metal pillars 130 in various regions of the example device 200, for example, regions other than the region where the semiconductor die 120 is positioned. For example, the upper substrate 230 may be electrically connected to the substrate 110 through the metal pillars 130.

As described above, the example semiconductor device 200 may be formed to have a fine pitch pattern (e.g., conductors, lands, traces, pads, etc.) by providing the metal pillars 130 without performing laser drilling (or ablation) on the encapsulant 140. In addition, the example semiconductor device 200 may be configured to provide for the stacking of another semiconductor device on the semiconductor device 200 (or vice versa), for example by having the upper substrate 230 connected to the metal pillars 130.

Hereinafter, an example method of a manufacturing a semiconductor device according to an embodiment of the present invention will be described. For example, the example method may be utilized to manufacturing any or all of the example semiconductor devices discussed herein, or any portion thereof.

FIGS. 3A to 3F show views illustrating an example method of manufacturing a semiconductor device according to various aspects of the present disclosure.

Figure 3A:
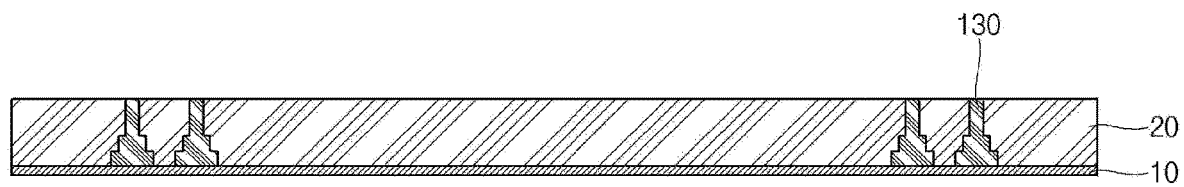
FIGS. 3A to 3F show views illustrating a method of manufacturing a semiconductor device according to various aspects of the present disclosure.

Referring to FIG. 3A, the example method of manufacturing a semiconductor device according to various aspects of the present disclosure may comprise providing (or forming) metal pillars 130 on a carrier substrate 10, and an insulation member 20 covering the metal pillars 130. The carrier substrate 10 may, for example, comprise a metal, a dielectric material, a semiconductor material, etc. The insulation member 20 may, for example, be formed by molding, but aspects of the present disclosure are not limited thereto. For example, the insulation member 20 may be formed by spin coating, vapor deposition, printing, etc. In addition, the insulation member 20 may be patterned on the carrier substrate 10, and electroplating or electroless plating may be performed, for example using the carrier substrate 10 as a seed layer, thereby forming the metal pillars 130. The metal pillars 130 may, for example, be made of copper (Cu), aluminum (Al), etc. The metal pillars 130 may, for example, be formed by plating the metal pillars 130, for example on a seed layer, on a conductive pattern (e.g., a pad, land, trace, etc.) of the carrier substrate 10, on a seed layer, etc.

Figure 3B:
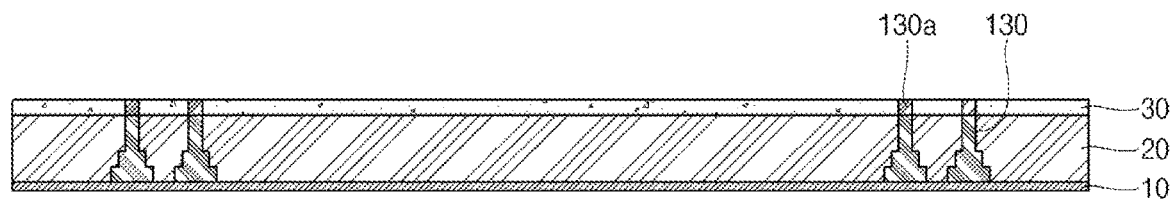

Referring to FIG. 3B, a photoresist 30 (or photoresist layer) is formed (e.g., coated, etc.) on the insulation member 20 and patterned, and electroplating or electroless plating is performed on regions exposed by the patterns of the photoresist 30, thereby increasing the height of the metal pillars 130. Such plating may, for example, be a same material as the metal pillars 130 and/or a different material. Also, conductive adhesion members 130a may further be formed on the metal pillars 130 (e.g., in addition to and/or instead of adding metal to the metal pillars 130). The conductive adhesion members 130a may, for example, be made of a general solder material, but aspects of the present invention are not limited thereto.

Figure 3C:
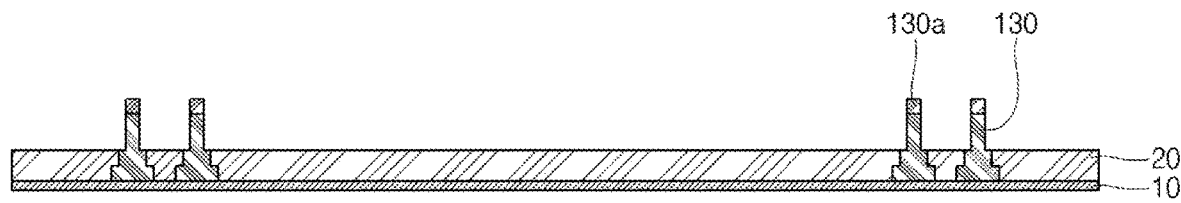

Referring to FIG. 3C, the photoresist 30 (or photoresist layer) and the carrier substrate 10 are removed. The photoresist 30 may be removed by, for example, a general ashing process, and the carrier substrate 10 may be removed by grinding (e.g., strip-grinding, etc.), by peeling off an adhesive tape if the adhesive tape is formed at an interface between the photoresist 30 and the carrier substrate 10, by chemical/mechanical planarization, etc. Accordingly, the conductive adhesion members 130a formed on the metal pillars 130 and the metal pillars 130 (or a portion thereof) may be exposed.

Figure 3D:
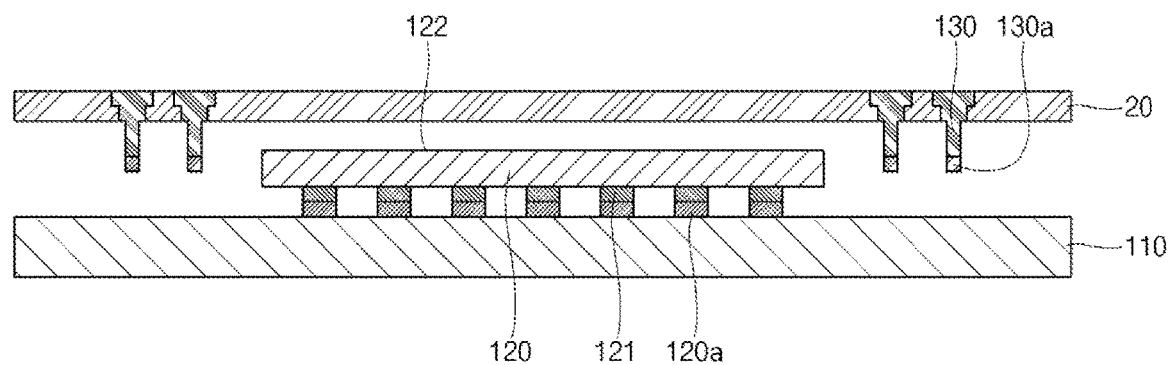

Referring to FIG. 3D, in a state in which the conductive adhesion members 130a are overturned to face downward, the metal pillars 130 are coupled to the substrate 110. In an example implementation, the substrate 110 may be in a state in which the semiconductor die 120 is coupled thereto in advance of the metal pillars 130, and the conductive adhesion members 130a may be aligned with respect to the patterns (e.g., traces, pads, lands, etc.) formed on the substrate 110, thereby coupling the metal pillars 130 and the substrate 110 to each other. Such coupling may, for example, be performed by thermocompression bonding, mass reflow, direct metal-to-metal (e.g., solderless) bonding, conductive adhesive, etc.

Figure 3E:
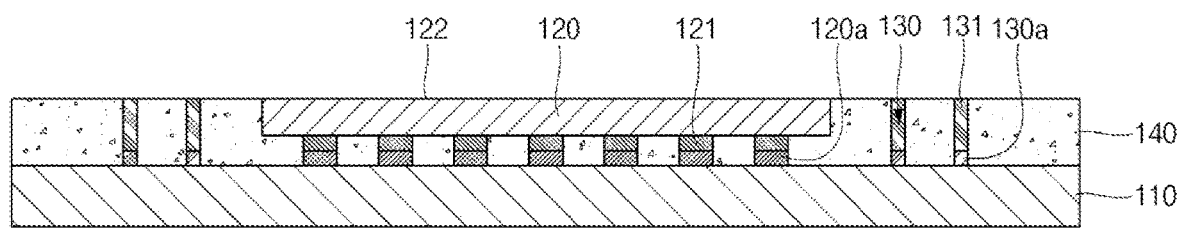

Referring to FIG. 3E, an encapsulant 140 (or encapsulating material) may fill a region between the insulation member 20 and the substrate 110 to encapsulate the semiconductor die 120 and the metal pillars 130. The encapsulant 140 may be formed to encapsulate internal components from at least one side (e.g., from the lateral sides, etc.). In addition, although not separately shown, a separate underfill may also be optionally formed around a conductive pad 121 of the semiconductor die 120 in advance of the encapsulant 140.

In addition, referring to FIG. 3E, after the forming of the encapsulant 140, the insulation member 20 may be removed. The insulation member 20 may, for example, be removed by grinding (e.g., strip-grinding, etc.), etching, chemical/mechanical planarization, etc. Accordingly, a top surface 122 of the semiconductor die 120 may be exposed from an upper portion (e.g., from an upper surface) of the encapsulant 140.

In this case, the metal pillars 130 (e.g., end surfaces thereof) may also be exposed from the upper portion of the encapsulant 140 and/or may also protrude upwardly from the top surface of the encapsulant 140, for example due to a difference in the physical property when the insulation member 20 is removed.

Figure 3F:
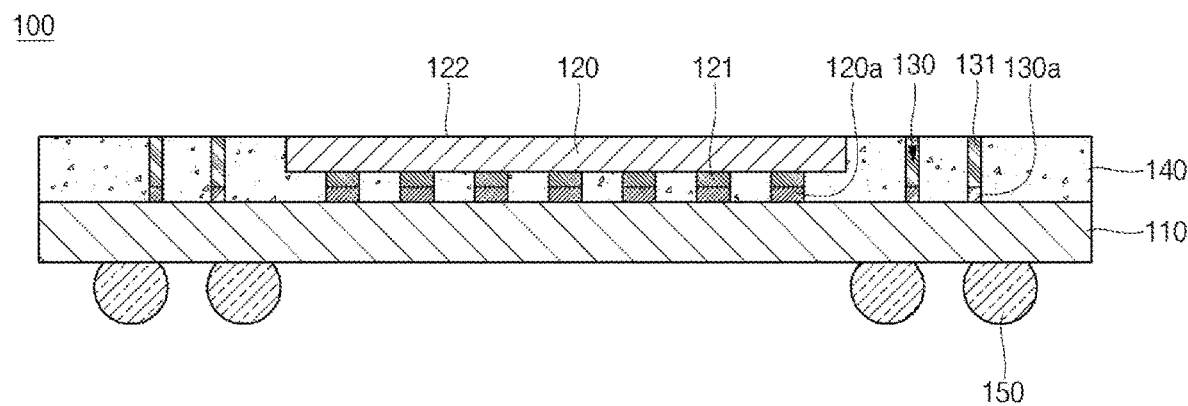

Referring to FIG. 3F, conductive balls 150 (or other interconnection structures, for example pillars, posts, bumps, etc.) are formed on a bottom surface of the substrate 110. The conductive balls 150 may be formed to correspond to patterns (e.g., traces, lands, pads, underbump metallization layers, etc.) on the bottom surface of the substrate 110, thereby providing a path for connection to an external circuit.

Hereinafter, another fabricating method of a semiconductor device according to an embodiment of the present invention will be described. For example, the example method may be utilized to manufacturing any or all of the example semiconductor devices discussed herein, or any portion thereof.

FIGS. 4A to 4I show views illustrating a method of manufacturing a semiconductor device according to various aspects of the present disclosure. The example method may, for example, share any or all characteristics with the example method illustrated in FIGS. 3A-3F.

Figure 4A:
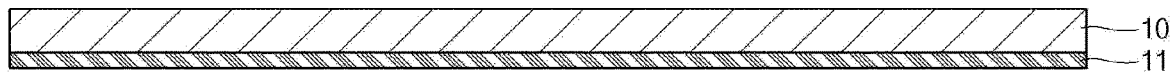
FIGS. 4A to 4I show views illustrating a method of manufacturing a semiconductor device according to various aspects of the present disclosure.
Figure 4B:
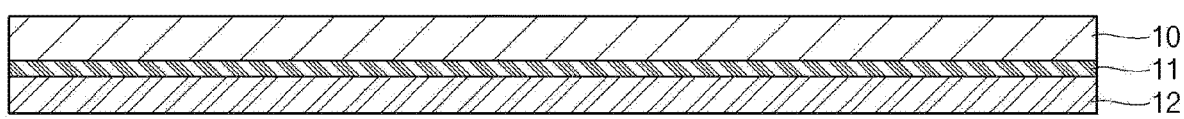

Referring to FIGS. 4A and 4B, an example method of manufacturing a semiconductor device according to various aspects of the present disclosure may comprise forming a seed layer 11 and a photoresist 12 (or photoresist layer) on a surface of a carrier substrate 10. The seed layer 11 may for example be formed of a metal, such as copper (Cu), or a metal sheet, but aspects of the present invention are not limited thereto.

Figure 4C:
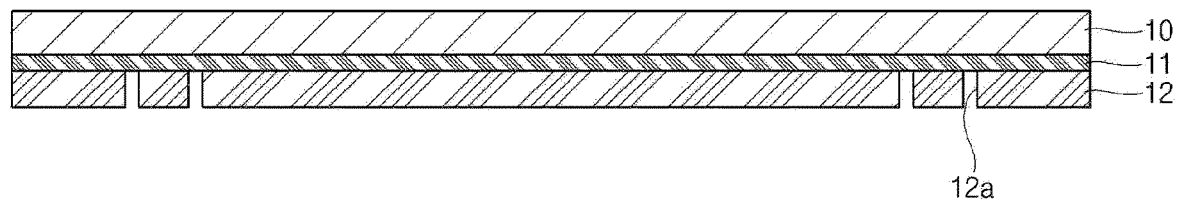

Referring to FIG. 4C, patterns are formed in the photoresist 12, for example through masking. The patterns may, for example, be configured to expose regions corresponding to metal pillars 130 to be formed later.

Figure 4D:
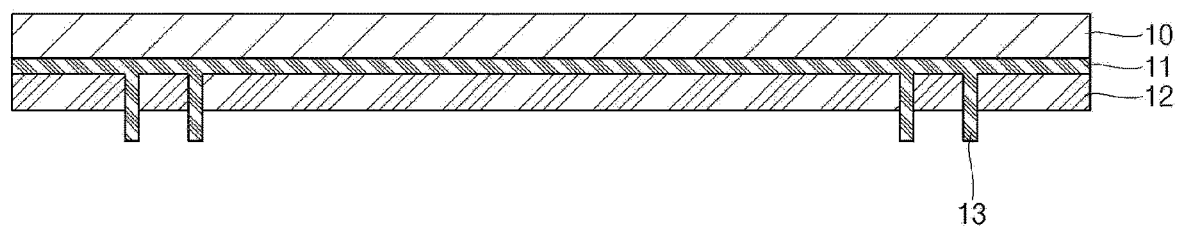

Referring to FIG. 4D, electroplating is performed using the seed layer 11 as a seed, thereby forming a plating layer 13. The plating layer 13 may be formed in and/or beyond the patterns 12a of the photoresist 12, for example on portions of the seed layer 11 exposed by the patterns 12a of the photoresist 12. Note that the plating layer 13 may be formed on any of a variety of conductive patterns (e.g., pads, lands, traces, etc.). The plating layer 13 may, for example, be integrally formed with a conductor on which the plating layer 13 is plated.

Figure 4E:
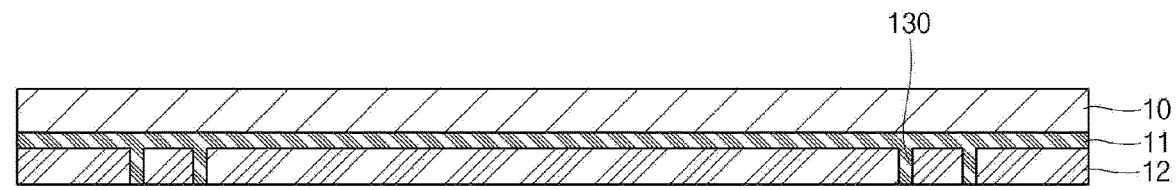

Referring to FIG. 4E, grinding (e.g., strip-grinding, etc.) or general thinning may be performed on the photoresist 12 and the plating layer 13. In addition, the plating layer 13 resulting from the grinding may constitute the metal pillars 130. However, this step is optionally performed. If this step is not performed, the plating layer 13 may be the same with the metal pillars 130.

Figure 4F:
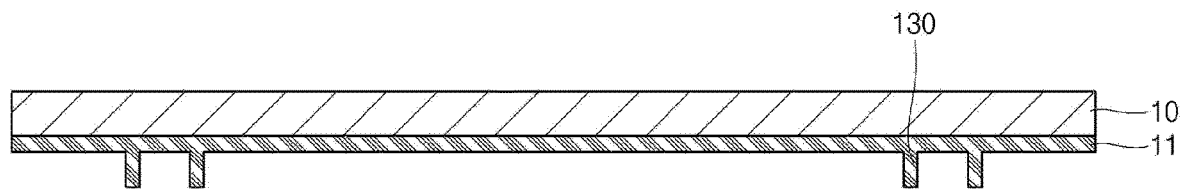

Referring to FIG. 4F, the photoresist 12 may be removed. As described above, the photoresist 12 may be removed by, for example, ashing, thereby exposing the seed layer 11 and the metal pillars 130.

Figure 4G:
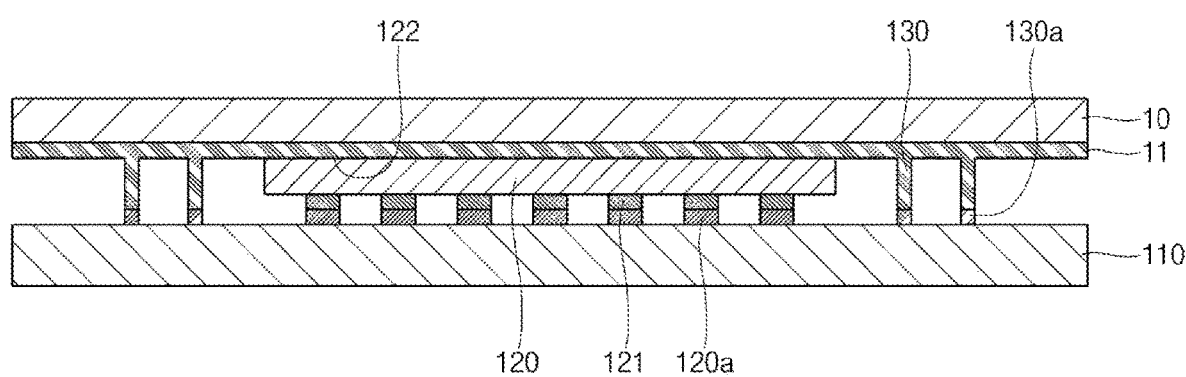

Referring to FIG. 4G, conductive adhesion members 130a are formed under the metal pillars 130, and the metal pillars 130 and the substrate 110 may be coupled to each other through the conductive adhesion members 130a. Note that the conductive adhesion members 130 may, for example, be formed on the metal pillars 130 as discussed herein with regard to FIG. 3, may be formed on the substrate 110 prior to attachment of the metal pillars 130, etc. Here, a semiconductor die 120 may be coupled to the substrate 110 in advance of the metal pillars 130. The conductive adhesion members 130a may, for example, be aligned with respect to the patterns (e.g., traces, pads, lands, etc.) formed on the substrate 110, thereby coupling the metal pillars 130 and the substrate 110 to each other.

Figure 4H:
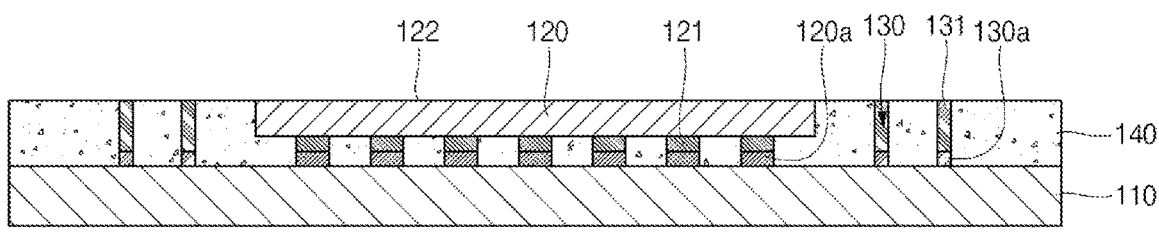

Referring to FIG. 4H, an encapsulant 140 (e.g., mold material, general dielectric material, etc.) may be formed (e.g., molded, spun coat, vapor deposited, etc.) to fill a region between the seed layer 11 and the substrate 110, for example to encapsulate the semiconductor die 120 and the metal pillars 130 (e.g., lateral surfaces thereof, etc.). The encapsulant 140 may, for example, be formed to encapsulate internal components from at least one side. In addition, although not separately shown, a separate underfill may also be optionally formed around a conductive pad 121 of the semiconductor die 120 in advance of the encapsulant 140.

In addition, referring to FIG. 4H, after the forming of the encapsulant 140, the carrier substrate 10 and the seed layer 11 may be removed. The insulation member 20 may, for example, be removed by grinding (e.g., strip-grinding, etc.), etching, chemical/mechanical planarizing, general planarizing, etc. Accordingly, a top surface 122 of the semiconductor die 120 may be exposed from an upper portion (e.g., from an upper surface) of the encapsulant 140. In this case, the metal pillars 130 (e.g., top surfaces thereof) may also be exposed from the upper portion of the encapsulant 140 and/or may also be formed to protrude upwardly from the top surface of the encapsulant, for example due to a difference in the physical property when the insulation member 20 is removed.

Figure 4I:
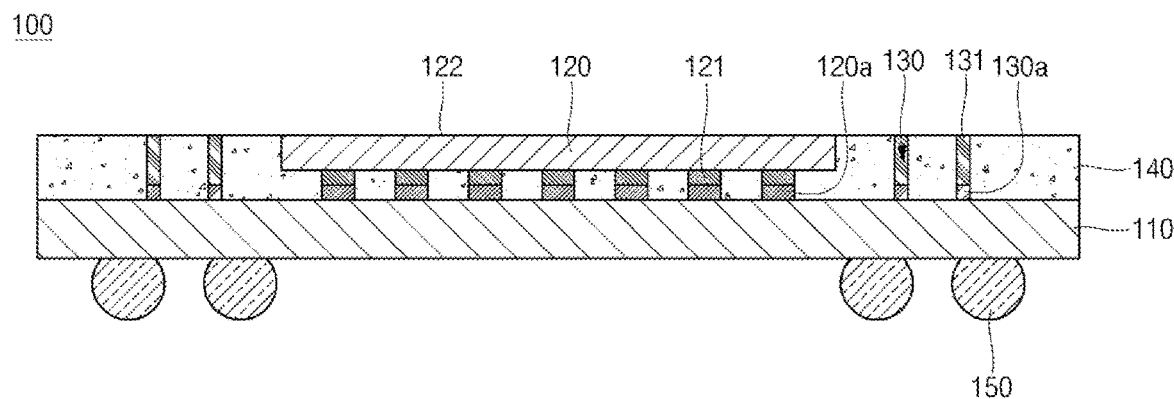

Referring to FIG. 4I, conductive balls 150 (or other interconnection structures, for example pillars, posts, bumps, etc.) are formed on a bottom surface of the substrate 110. The conductive balls 150 may be formed to correspond to patterns (e.g., traces, lands, pads, underbump metallization layers, etc.) formed on the bottom surface of the substrate 110, thereby providing a path for connection to an external circuit.

Hereinafter, a fabricating method of a semiconductor device according to another embodiment of the present invention will be described. For example, the example method may be utilized to manufacturing any or all of the example semiconductor devices discussed herein, or any portion thereof.

FIGS. 5A to 5F show views illustrating a method of manufacturing a semiconductor device according to various aspects of the present disclosure. The example method may, for example, share any or all characteristics with the example method illustrated in FIGS. 3A-3F and/or with the example method illustrated in FIGS. 4A-4I.

Figure 5A:
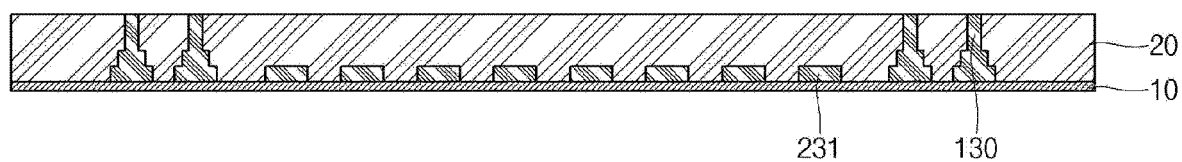
FIGS. 5A to 5F show views illustrating a method of manufacturing a semiconductor device according to various aspects of the present disclosure.

Referring to FIG. 5A, an example method of manufacturing a semiconductor device according to various aspects of the present disclosure may comprise providing (or forming) conductive patterns 231 (e.g., traces, lands, pads, etc.) and metal pillars 130 on a carrier substrate 10, and an insulation member 20 covering the conductive patterns 231 and the metal pillars 130. The insulation member 20 may, for example, be formed by molding, but aspects of the present disclosure are not limited thereto. For example, the insulation member 20 may be formed by spin coating, vapor deposition, printing, etc.

In addition, in an example implementation, the insulation member 20 may first be patterned on the carrier substrate 10, and electroplating or electroless plating may be performed, for example using the carrier substrate 10 as a seed layer, thereby forming the conductive patterns 231. Next, after the patterning of the insulation member 20, plated metal pillars

130 may be formed, for example using the conductive patterns 231 (e.g., pads, lands, traces, etc.) and/or carrier substrate 10 as a seed layer. The plating layer 13 may, for example, be integrally formed with a conductor on which the plating layer 13 is plated (e.g., a seed layer, pad, land, trace, etc.).

Figure 5B:
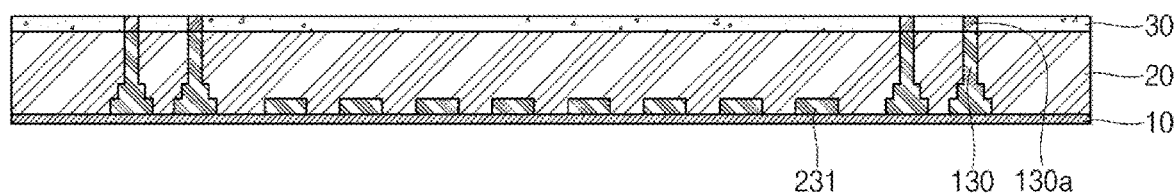

Referring to FIG. 5B, a photoresist 30 (or photoresist layer) is formed (e.g., coated, etc.) on the insulation member 20 and patterned, and electroplating or electroless plating is performed on regions exposed by the patterns of the photoresist 30, thereby increasing the height of the metal pillars 130. Such plating may, for example, be a same material as the metal pillars 130 and/or a different material. Also, conductive adhesion members 130a may further be formed on the metal pillars 130 (e.g., in addition to and/or instead of adding metal to the metal pillars 130). The conductive adhesion members 130a may, for example, be made of a general solder material, but aspects of the present invention are not limited thereto.

Figure 5C:
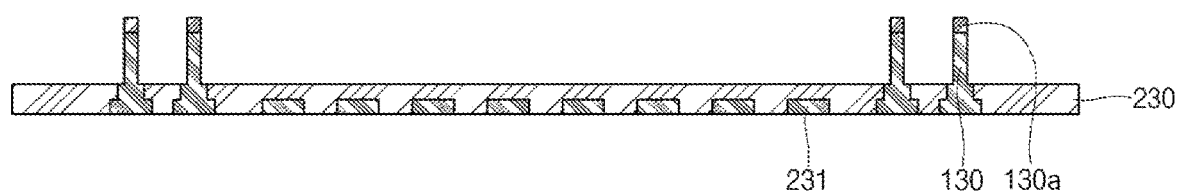

Referring to FIG. 5C, the photoresist 30 (or photoresist layer) and the carrier substrate 10 are removed. The photoresist 30 may be removed by, for example, a general ashing process, and the carrier substrate 10 may be removed by grinding (e.g., strip-grinding, etc.), or by peeling off an adhesive tape if the adhesive tape is formed at an interface between the photoresist 30 and the carrier substrate 10, by chemical/mechanical polarization, etc. Accordingly, the conductive adhesion members 130a formed on the metal pillars 130 and the metal pillars 130 (or a portion thereof) may be exposed. In such a manner, the example upper substrate 230 having the conductive patterns 231 and the metal pillars 130 may be formed. In this step, a portion of the insulation member 20 may also be removed, thereby further exposing the metal pillars 130. In an example implementation, if a thickness of the insulation member 20 is reduced and a thickness of the photoresist 30 is increased, considerable portions of the metal pillars 130 may be exposed by removing the photoresist 30.

Figure 5D:
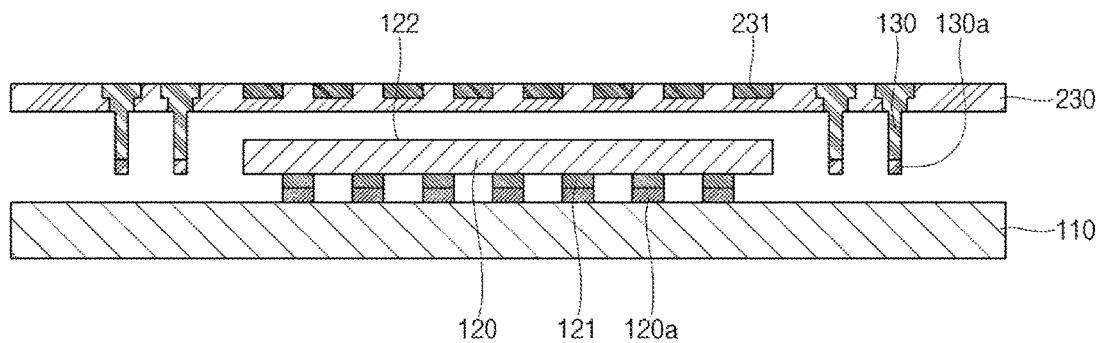

Referring to FIG. 5D, in a state in which the conductive adhesion members 130a are overturned to face downward, the metal pillars 130 are coupled to the substrate 110. In an example implementation, the substrate 110 may be in a state in which the semiconductor die 120 is coupled thereto in advance of the metal pillars 130, and the conductive adhesion members 130a may be aligned with respect to the patterns (e.g., traces, pads, lands, etc.) formed on the substrate 110, thereby coupling the metal pillars 130 and the substrate 110 to each other. Such coupling may, for example, be performed by thermocompression bonding, mass reflow, direct metal-to-metal (e.g., solderless) bonding, conductive adhesive, etc.

In addition, referring to FIG. 5D, the conductive patterns 231 of the upper substrate 230 may be upwardly exposed. Therefore, a semiconductor device to be stacked in a subsequent step can be easily electrically connected to the conductive patterns 231.

Figure 5E:
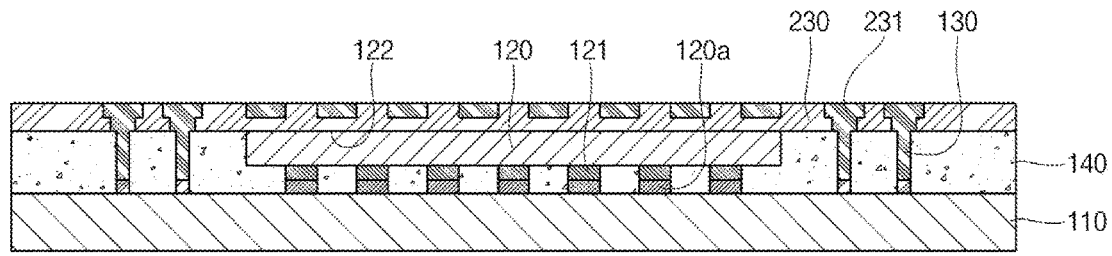

Referring to FIG. 5E, an encapsulant 140 (or encapsulating material) may fill a region between the upper substrate 230 and the substrate 110 to encapsulate the semiconductor die 120 and the metal pillars 130. The encapsulant 140 may be formed to encapsulate internal components from one side (e.g., from the lateral sides, etc.). In addition, although not separately shown, a separate underfill may also be optionally formed around a conductive pad 121 of the semiconductor die 120 in advance of the encapsulant 140.

Figure 5F:
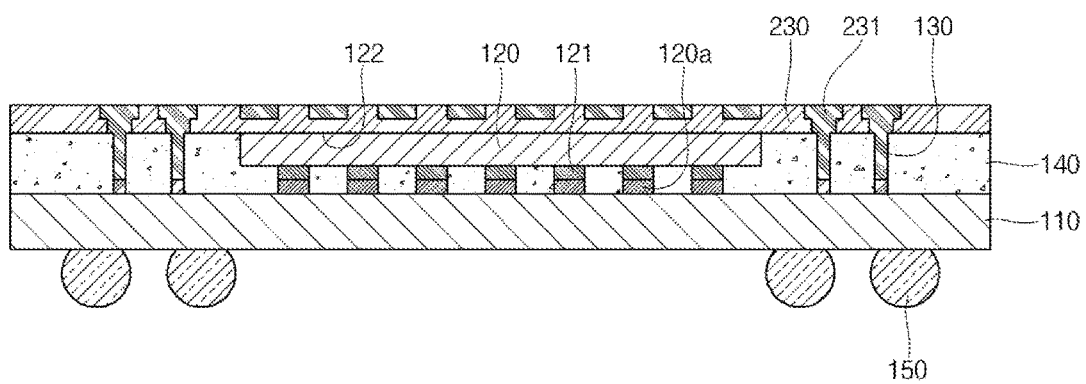

Referring to FIG. 5F, conductive balls 150 (or other interconnection structures, for example pillars, posts, bumps, etc.) are formed on a bottom surface of the substrate 110. The conductive balls 150 may be formed to correspond to patterns (e.g., traces, lands, pads, underbump metallization layers, etc.) on the bottom surface of the substrate 110, thereby providing a path for connection to an external circuit.

While the semiconductor device and the fabricating method thereof according to various aspects of the present disclosure have been described with reference to certain supporting examples and/or implementations, it will be understood by those skilled in the art that scope of the present disclosure is not be limited to the particular examples disclosed, but that the present disclosure will include all embodiments, examples, and implementations falling within the scope of the appended claims.

The discussion herein included numerous illustrative figures that showed various portions of an electronic device assembly and method of manufacturing thereof. For illustrative clarity, such figures did not show all aspects of each example assembly. Any of the example assemblies and/or methods provided herein may share any or all characteristics with any or all other assemblies and/or methods provided herein.

In summary, various aspects of this disclosure provide a semiconductor device and a method of manufacturing a semiconductor device. As a non-limiting example, various aspects of this disclosure provide a stackable semiconductor device with small size and fine pitch and a method of manufacturing thereof. While the foregoing has been described with reference to certain aspects and examples, it will be understood by those skilled in the art that various changes may be made and equivalents may be substituted without departing from the scope of the disclosure. In addition, many modifications may be made to adapt a particular situation or material to the teachings of the disclosure without departing from its scope. Therefore, it is intended that the disclosure not be limited to the particular example(s) disclosed, but that the disclosure will include all examples falling within the scope of the appended claims.

What is claimed is:

1. A semiconductor device comprising:
    a substrate having a top substrate side, a bottom substrate side, and lateral substrate sides extending between the top and bottom substrate sides, the substrate comprising a top side pad, a bottom side pad, and one or more conductive paths that electrically coupled the top side pad to the bottom side pad;
    a semiconductor die having a top die side, a bottom die side, and lateral die sides extending between the top and bottom die sides, wherein the bottom die side is coupled to the top substrate side;
    a metal pillar having a top pillar end, a bottom pillar end, and a lateral pillar side extending between the top and bottom pillar ends, wherein:
        the metal pillar is positioned laterally outside a region of the top substrate side covered by the semiconductor die;
        at least a portion of the metal pillar is positioned directly lateral to the semiconductor die;
        the bottom pillar end is lower than the bottom die side;
        the bottom pillar end is coupled to the top side pad of the substrate with an adhesion member; and
    an encapsulating material laterally adjacent the lateral die sides and the lateral pillar side; and
    a mold material that directly contacts a widest portion of the lateral pillar side, wherein the mold material directly contacts the encapsulating material.

2. The semiconductor device of claim 1, wherein the adhesion member comprises solder or epoxy.

3. The semiconductor device of claim 1, wherein the metal pillar comprises copper.

4. The semiconductor device of claim 1, wherein the metal pillar comprises a plated copper pillar.

5. The semiconductor device of claim 1, wherein the metal pillar is no wider than 15 µm.

6. The semiconductor device of claim 1, wherein a portion of the encapsulating material is directly vertically between the top substrate side and the bottom die side.

7. The semiconductor device of claim 1, wherein the encapsulating material directly contacts and laterally surrounds the adhesion member.

8. The semiconductor device of claim 1, wherein most of the metal pillar is lower than the top die side.

9. The semiconductor device of claim 1, wherein the encapsulating material comprises a plurality of lateral sides, each of which being coplanar with a respective one of the lateral substrate sides.

10. The semiconductor device of claim 1, wherein the top pillar end is solderless.

11. A semiconductor device comprising:
   a substrate having a top substrate side, a bottom substrate side, and lateral substrate sides extending between the top and bottom substrate sides;
   a semiconductor die having a top die side, a bottom die side, and lateral die sides extending between the top and bottom die sides, wherein the bottom die side is coupled to the top substrate side;
   a metal pillar having a top pillar end, a bottom pillar end, and a lateral pillar side extending between the top and bottom pillar ends, wherein:
      at least a portion of the metal pillar is positioned directly lateral to the semiconductor die;
      the bottom pillar end is coupled to the top substrate side with an adhesion member comprising solder; and
   an encapsulating material laterally adjacent the lateral die sides and the lateral pillar side, wherein the encapsulating material comprises a plurality of lateral sides, each of which being coplanar with a respective one of the lateral substrate sides; and
   a mold material that directly contacts a widest portion of the lateral pillar side, wherein the mold material directly contacts the encapsulating material.

12. The semiconductor device of claim 11, wherein the mold material comprises a lateral side coplanar with one of the lateral substrate sides.

13. The semiconductor device of claim 11, wherein the metal pillar comprises copper.

14. The semiconductor device of claim 11, wherein the metal pillar comprises a plated copper pillar.

15. The semiconductor device of claim 11, wherein the bottom pillar end is lower than the bottom die side.

16. The semiconductor device of claim 11, wherein a portion of the encapsulating material is directly vertically between the top substrate side and the bottom die side.

17. The semiconductor device of claim 11, wherein the encapsulating material directly contacts and laterally surrounds the adhesion member.

18. The semiconductor device of claim 11, wherein most of the metal pillar is lower than the top die side.

19. The semiconductor device of claim 11, wherein at least a bottom side of the mold material directly contacts the encapsulating material.

20. The semiconductor device of claim 11, wherein the top pillar end is solderless.

\* \* \* \* \*